United States Patent [19]

Hardell, Jr. et al.

[11] Patent Number: 5,588,010
[45] Date of Patent: Dec. 24, 1996

[54] PARALLEL ARCHITECTURE ERROR CORRECTION AND CONVERSION SYSTEM

[75] Inventors: William R. Hardell, Jr.; Amjad Z. Qureshi, both of Austin, Tex.

[73] Assignee: International Business Machines Corporation, Armonk, N.Y.

[21] Appl. No.: 282,334

[22] Filed: Jul. 29, 1994

[51] Int. Cl.⁶ .......................... H03M 13/00; G06F 11/10
[52] U.S. Cl. ...................... 371/37.6; 371/37.1; 371/40.3
[58] Field of Search .................... 371/37.6, 37.1, 371/40.1, 40.3

[56] References Cited

U.S. PATENT DOCUMENTS

| | | | |
|---|---|---|---|
| 3,851,306 | 11/1974 | Patel | 371/40.3 |
| 4,345,328 | 8/1982 | White | 371/37.7 |
| 4,397,022 | 8/1983 | Weng et al. | 371/37.1 |
| 4,661,956 | 4/1987 | Izumita et al. | 371/37.1 |
| 4,736,376 | 4/1988 | Stiffler | 371/37.1 |
| 5,068,855 | 11/1991 | Kashida et al. | 371/37.4 |
| 5,155,734 | 10/1992 | Kashida et al. | 371/37.1 |
| 5,361,266 | 11/1994 | Kodama et al. | 371/37.7 |
| 5,384,788 | 1/1995 | Parks et al. | 371/37.7 |

*Primary Examiner*—Stephen M. Baker
*Attorney, Agent, or Firm*—Casimer K. Salys

[57] ABSTRACT

A system and method for converting data with one error correction code format to data with a different error correction code format, including provisions for correcting the errors in the input data and checkbits. The invention reduces the levels of logic needed to accomplish the conversion. In one form, checkbits for the converted data are generated from the input data at the same time that the input data correction syndromes are generated from the input data and checkbits. Multiple sets of error pointers are then used to simultaneously correct both the converted data and the converted data checkbits.

11 Claims, 5 Drawing Sheets

PARALLEL ARCHITECTURE ERROR CORRECTION AND CONVERSION SYSTEM

FIELD OF THE INVENTION

The present invention relates in general to systems and methods for correcting errors in strings of digital data. More particularly, the invention is directed to an efficient system architecture and method for implementing error correction code techniques when converting digital data from one error correction code format to another.

BACKGROUND OF THE INVENTION

Techniques to detect and correct soft or hard errors in digital data bit strings introduced during electronic operations such as storage, transmission or processing are well known in the computer industry. It is now a common practice to include bits, such as those characterized by the Hamming code, in data undergoing processing to ensure that all of the bits of a string of digital data correctly represent the information, or at minimum to detect that the information has errors.

The general practice of error detection and correction involves the inclusion of special bits, checkbits, to the string representing the actual data, and then the use of the combined bit string to detect and correct errors through syndromes and error pointers. The ultimate goal is to detect the presence of errors in the bit string of the data and to identify the error locations for corrective action.

The use of error correction is particularly prevalent in digital data transmission systems and storage systems, where time or external physical phenomena are likely to cause spurious or soft errors in the data bits. Error correction is equally valuable in handling hard errors, such as may be caused by permanent device failures. A specific example, to which the embodiment of the present invention is directed, involves the storage of data in integrated circuit dynamic memory devices (DRAMs) which by virtue of their miniaturization are suspectable to a mix of errors.

A variety of different error correction code techniques are known and in use. Representative examples include applications involving a single long data word with single bit error correct and double bit error detect capability, two (or more) short data words with single bit error correct and double bit error detect capability, and a single long data word with multiple bit error correct capability. Translation from one form to another requires conversion of the associated checkbits.

An important aspect of error correction code use involves the efficient conversion of data stored or transmitted in error correction coded bit strings. For example, it is not unusual to combine two or four 32-bit long words into 64 or 128-bit strings, respectively, for purposes of storage or transmission over wide buses or radio frequency media, and at a later stage to partition the extended bit string back into the 32-bit words. A strong motivation for managing data in this format arises from the fact that error detection and correction can be accomplished more efficiently, in terms of checkbits per data bits, as the length of the data string increases.

For example, a single 64-bit string with single bit correction and double bit detection requires a total of 72 bits (64+8). On the other hand, two 32-bit strings with individual single bit correction and double bit detection require a total of 78 bits (32+7 and 32+7).

With the recognition that integrated circuit memory devices are suspectable to soft errors, data is preferably stored in DRAM using groups of two or four 32-bit words, respectively 64 or 128-bit combinations, together with the associated checkbits. For example, combining two 32-bit words into a single 78-bit combination having 14 checkbits allows four data bit errors to be corrected. In contrast, if each of the 32-bit strings were managed with respective 7 checkbits the best that could be accomplished is one error correction and one error detection per 32-bit word. Error correction is a significantly more valuable capability than mere error detection. Thus, in the context of data storage where errors are likely, it is more efficient to combine words for purposes of storage. A similar preference applies to the transmission of data in longer bit strings over buses, where wide buses are preferred from a layout and data transfer rate perspective. On the other hand, when data is being moved on or off integrated circuit chips, pin limitations motivate the use of shorter bit strings of data.

Conventional systems for converting data between long and short bit strings utilize architectures which correct the errors in the first data bit string and then use the corrected data bit string to generate the checkbits for the data in converted form. Unfortunately, this sequence typically requires processing through 13 or so levels of integrated circuit device logic to accomplish both the correction and checkbit generation operations. Given the importance of efficient bit management, accentuated need error correction, and data transfer speed, a need exists for accomplishing this conversion using the fewest levels of logic possible.

SUMMARY OF THE INVENTION

The present invention defines an error correction code conversion system comprising a means for receiving an input of uncorrected bits including a first bit string of data bits and a second string of check bits, means for generating error pointers from the input, means for generating checkbits using first string data bits, and means for correcting both the first string data bits and the generated checkbits using the error pointers. In another form, the invention is directed to analogous methods for accomplishing the conversion.

In a preferred practice of the invention, an input bit string of multiple data words and checkbits is received from a storage medium, typically DRAM. The uncorrected input data is, upon reformatting such as by partitioning, used to generate the checkbits for the reformatted data. This occurs at the same time that the syndromes are generated from the original input data. Input data error correction pointers are derived from the syndromes. These input data error pointers are used to correct both the reformatted input data and the new checkbits. The concurrence of new checkbit generation with the syndrome generation reduces the logic level count from the representative 13 in the prior art to a nominal 10 levels, and thereby accentuates the conversion speed by a correspondingly large percentage.

These and other features of the invention will be more clearly understood and appreciated upon considering the detailed description which follows.

BRIEF DESCRIPTION OF THE DRAWINGS

FIG. 8 sets forth the H matrix for a preferred error correction code.

FIG. 9 sets forth a preferred table of syndromes for error correction code generation.

DESCRIPTION OF THE PREFERRED EMBODIMENT

Figure 1:
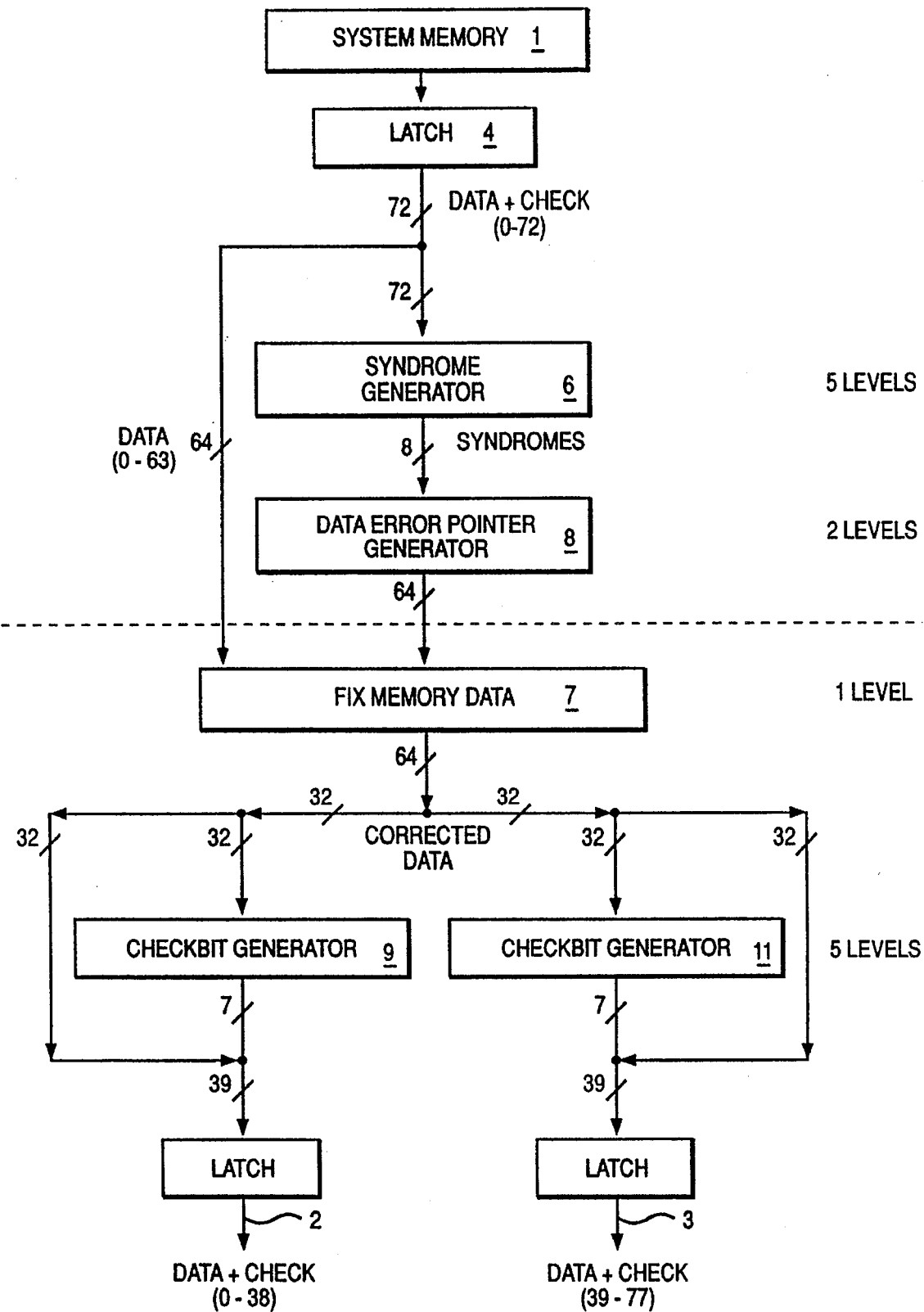
FIG. 1 is a schematic block diagram of a conventional error corrected data conversion system.

FIG. 1 schematically depicts by functional block diagram the operations and associated levels of logic conventionally used to convert error corrected code from a 64-bit word length as stored in memory 1 to a pair of 32-bit word length words provided as outputs on buses 2 and 3. The information as provided from memory 1 and held in latch 4 is composed of 64 data bits and 8 checkbits. The corresponding outputs on buses 2 and 3 are each composed of 32-bits of the data and 7 checkbits. The longer, 72-bit, string is used in DRAM to reduce the cost of the memory array, given that longer strings need fewer checkbits per data bit to obtain comparable levels of error correction. Buses 2 and 3 use 32-bit data to be compatible with the multiple chips at the next level of logic. The 7 checkbits for each bus 2 and 3 provide the capability to correct one bit error and to detect two bit errors.

The 72-bit combination of input data and checkbits in latch 4 is provided to syndrome generator 6 as the 64-bits of uncorrected data are conveyed forward to fix memory data block 7. In conventional manner, syndrome generator 6 creates 8 syndrome bits, which are logically combined in data error pointer generator 8 to create 64 error pointers. The error pointers identify the correction locations in the 64-bits of uncorrected data forwarded from latch 4. The 64-bits of corrected data from fix memory data block 7 are then split into two 32-bit data words. As shown, one 32-bit word is provided to checkbit generator 9, and therein used to create the seven checkbits which will ensure accuracy of the 32-bit word during subsequent logic manipulator and processing. A similar function is accomplished in checkbit generator 11 for the other 32-bit word.

To the right of the blocks in FIG. 1 there are shown relative measures of the logic levels necessary to accomplish the functions when designed with exemplary electronic devices. As shown, the conversion requires 13 levels of logic. Since each level represents at least one logic gate, the delay through such conversion is significant and becomes an accentuated subject of concern as system clock frequencies increase. With different logic technologies the absolute number of levels change, but the benefits of the present invention remain.

Figure 2:
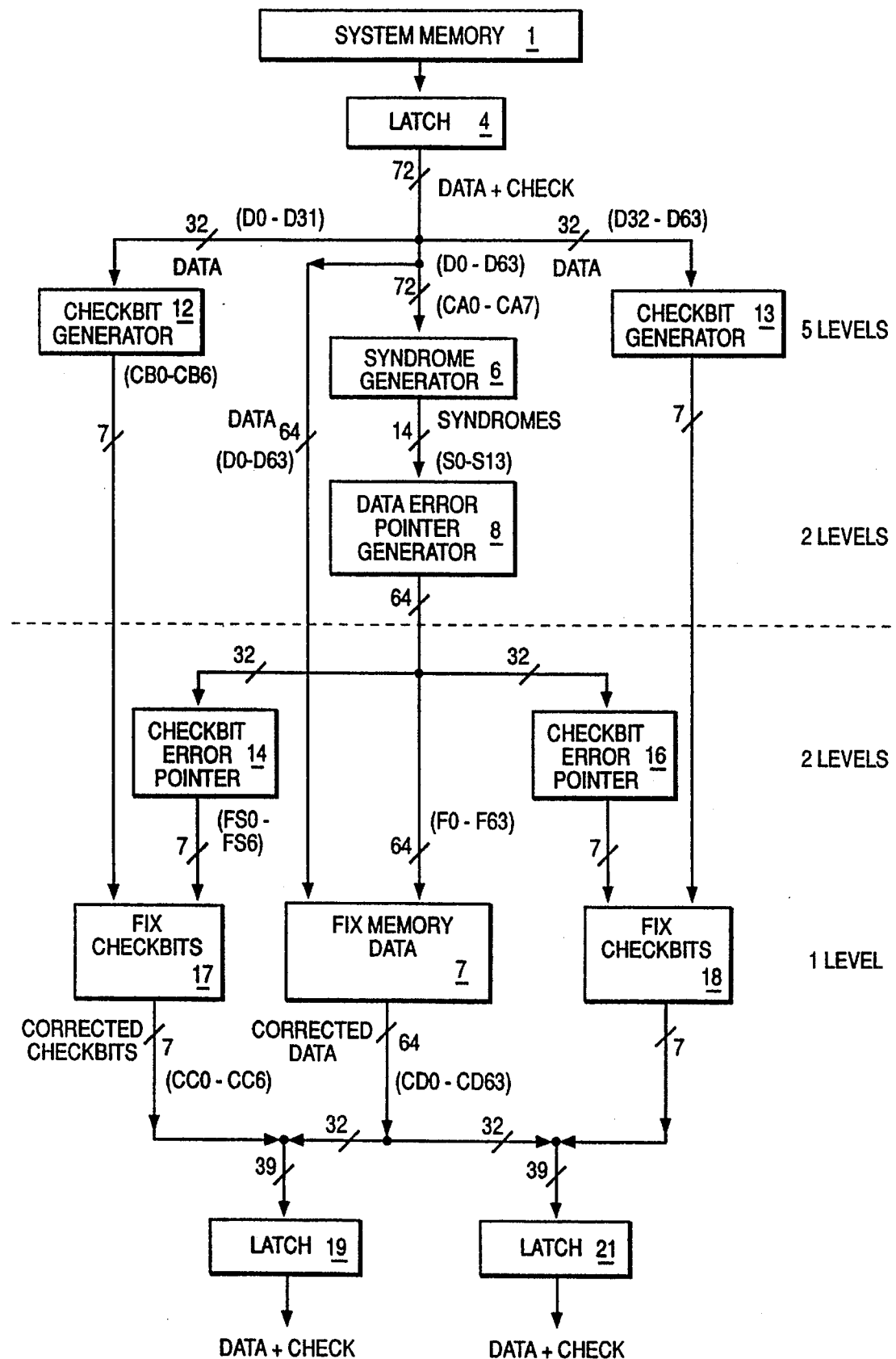
FIG. 2 is a schematic block diagram of a conversion system according to the present invention.

FIG. 2 illustrates by way of one embodiment a practice of an analogous conversion, namely between data stored in a 64 plus 8 bit format to data available in two sets of 32 plus 7 bit format. Note that the levels of logic needed to accomplish the functions above the dash line correspond to the number used in the prior art of FIG. 1, likewise differentiated by a dashed line. In contrast to the six levels of logic required to accomplish the conversion operations occurring below the dash line in FIG. 1, the present invention accomplishes the same overall functions with only three levels of logic.

The improved performance is due to the fact that the relatively complex checkbit generation function is performed at the same time that the syndrome generation is accomplished, even though the data used to generate the checkbits is of questionable accuracy at that stage.

As shown in FIG. 2, the 64-bits of uncorrected data from latch 4 are divided into two distinct 32-bit word segments and are individually provided to checkbit generators 12 and 13. Checkbit generators 12 and 13 create respective 7-bit long checkbits for each 32-bit data string. However, since the accuracy of the data at that stage is questionable, so too are the checkbits generated from the data. However, correction of checkbits can be accomplished significantly faster than the generation of the checkbits, even though the composite operations accomplished below the dashed line involve both the generation of checkbit error pointers and the correction of the earlier generated checkbits.

Again with reference to FIG. 2, the 64-bits from data error pointer generator 8 are provided to fix memory data block 7 for purposes of identifying which of the 64-bits of data from memory 1 need to be corrected.

The invention as embodied also includes a checkbit error pointer for each bit string of the converted output, in this case checkbit error pointers 14 and 16. Each checkbit error pointer receives 32 outputs from data error pointer generator 8. Each checkbit error pointer 14 and 16 then generates a respective set of seven error pointers which correct the seven checkbits speculatively generated from the potentially erroneous memory data. The correction of the checkbits is accomplished in fix checkbit blocks 17 and 18, respectively responsive to checkbit error pointers 14 and 16.

The outputs of fix checkbit blocks 17 and 18 are the seven corrected checkbits for each respective 32-bit string of data. When combined with the data, the composite result is two 39-bit long strings of information composed of data and checkbits with resources to correct one error and to detect two errors in successive processing operations. Often, the 39 bits are entered into respective latches, such as 19 and 21.

Note again by the levels of logic designated at the right in FIG. 2, that the composite conversion is accomplished in 10 levels, as opposed to the 13 levels representative of the prior art as appears in FIG. 1. This represents a reduction of approximately 25 percent in the gate delays through the logic.

Figure 3:
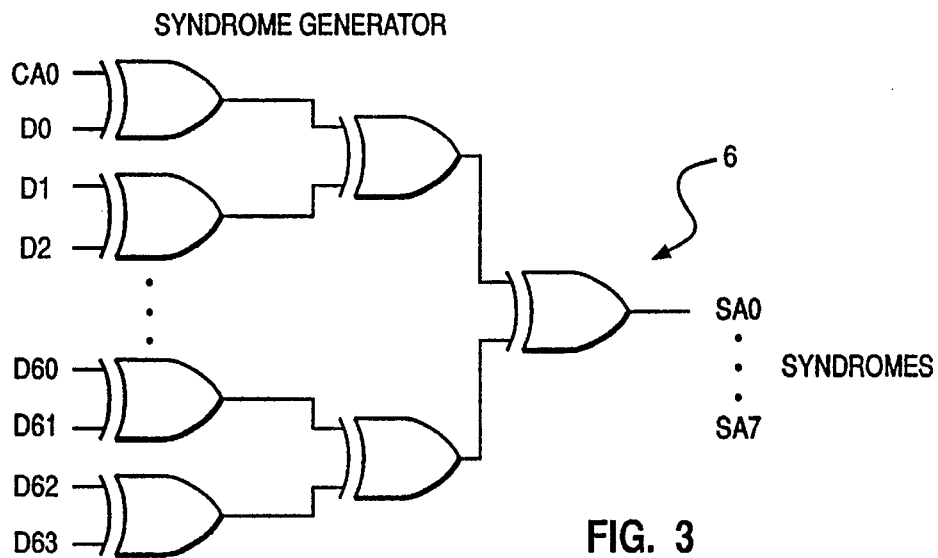
FIG. 3 schematically illustrates syndrome generator logic.
Figure 4:
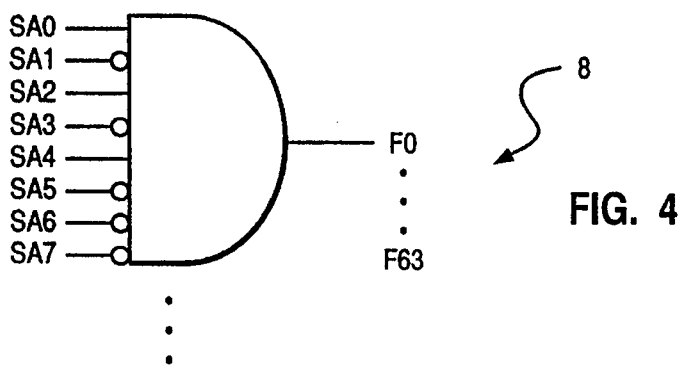
FIG. 4 schematically illustrates data error pointer generator logic.
Figures 8, 9:
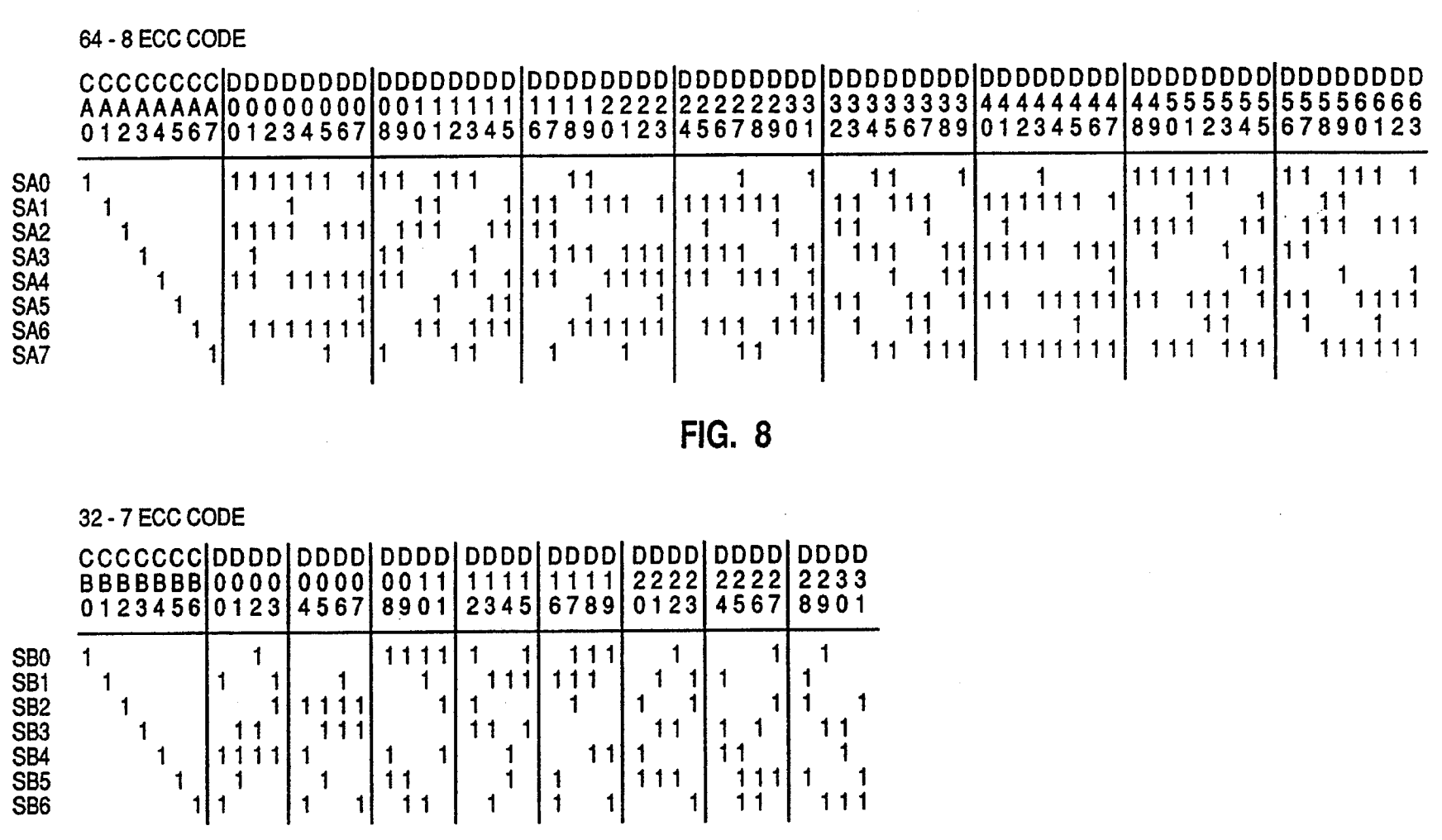

The input and output signals to the various blocks are designated by alpha-numerics in FIG. 2, and correspondingly identified in the succession of logic drawings of FIGS. 3–7. FIGS. 3 and 4 depict the logic within syndrome generator 6 and data error pointer generator 8. The syndrome table appearing in the FIG. 8 defines the binary logic used to specify the inputs to the AND gates in data error pointer generator 8 of FIG. 4. The 8 syndrome signals (SA0–SA7) are the inputs to the AND gates, while the outputs are the fix signals (F0–F63). The 64 fix signals are used to correct the 64-bits of data (D0–D63) within fix memory data block 7, and to thereby provide corrected data (CD0–CD63) as an output.

Figure 5:
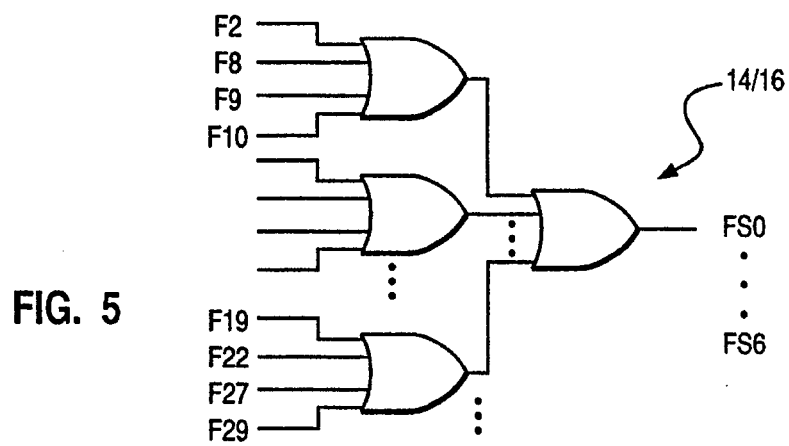
FIG. 5 schematically illustrates checkbit error pointer logic.

The logic within checkbit error pointer blocks 14 and 16 is shown in FIG. 5 to be fundamentally composed of OR gates. In the embodiment, the fix syndrome bits (FS0–FS6) are derived from the fix bits (F0–F63) as defined by the table in FIG. 9.

Figure 6:
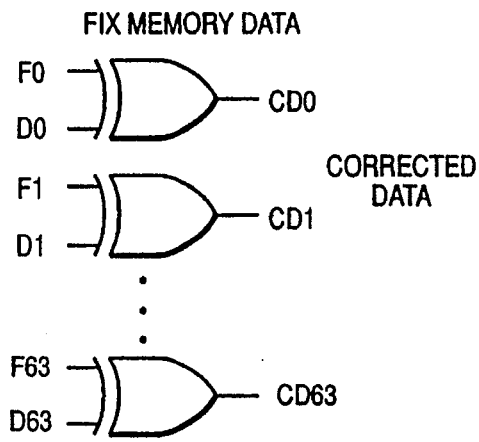
FIG. 6 schematically illustrates fix memory data logic.
Figure 7:
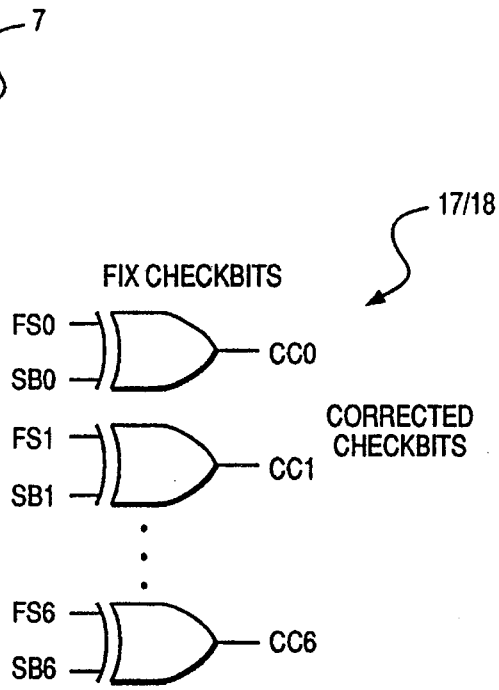
FIG. 7 schematically illustrates fix checkbit logic.

Fix memory data block 7 is composed of XOR logic as shown in FIG. 6, by data bit position. The corrected data output (CD0–CD63) by bit position is the result of an XOR combination of the fix bit and corresponding data bit. Similarly, fix checkbit blocks 17 and 18 are shown by logic elements in FIG. 7 to be composed of XOR gates by respective bit positions. The corrected checkbits (CC0–CC6) are respectively defined by the XOR combination of the corresponding inputs of an uncorrected checkbit (CO–C6) and fix syndrome input (FS0–FS6). Although AND, OR and XOR gates were used in this embodiment, functionally equivalent configurations using NAND, NOR and XNOR gates can be more appropriate depending on the integrated circuit technology being used.

The invention as embodied in FIG. 2, is applicable to any error correction code conversion. The applications can involve volatile or nonvolatile memory storage events, or other digital error correction coded information manipulation operations which involve changing the number of the data bits subject to individualized consideration. The key benefit is decreasing the number of logic levels and corresponding gate delays.

Figure 10:
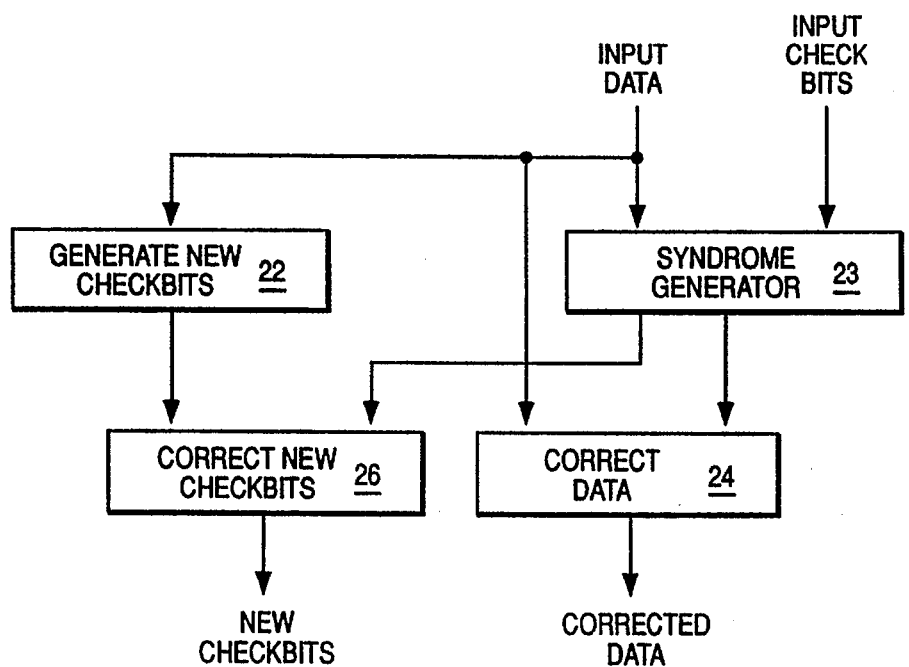
FIG. 10 is a schematic block diagram of the architecture for a generic converter.

FIG. 10 illustrates the broad scope of the underlying invention. Namely, the invention involves the generation of checkbits from the uncorrected input data in generate new checkbits block 22 during a time interval that error correction pointer information is being derived in syndrome generator 23. The correction as subsequently applied in correct data block 24 and correct new checkbits block 26 concurrently correct the input data and any errors in checkbits derived from errors in the input data.

Though the invention has been described and illustrated by way of specific embodiment, these systems and methods encompassed by the invention should be interpreted in keeping with the breadth of the claims set forth hereinafter.

We claim:

1. An error correction code conversion system, comprising:
   means for generating error correction code checkbits from uncorrected input data:
   means for identifying corrections needed in the generated error correction code checkbits based upon the uncorrected input data and input checkbits related thereto; and
   means for correcting tile generated error correction code checkbits responsive to the means for identifying.

2. The system recited in claim 1, wherein the means for identifying generates pointers to identify corrections.

3. The system recited in claim 2, wherein the pointers are derived from pointers used to correct the input data.

4. An error correction code conversion system, comprising:
   means for receiving an input of uncorrected bits, including a first string of data bits and a second string of checkbits;
   means for generating error pointers from the input;
   means for generating checkbits using first string data bits; and
   means for correcting both the first string data bits and the generated checkbits using the error pointers.

5. The system recited in claim 4, wherein the means for generating error pointers comprises first generated error pointers used for the first string of bits and second generated error pointers used for the generated checkbits.

6. The system recited in claim 5, where the means for generating error pointers from the input includes a syndrome generator receiving the input.

7. The system recited in claim 6, wherein the means for correcting the first string data bits and the generated checkbits is comprised of XOR logic.

8. A method of converting code with error correction, comprising the steps of:
   receiving an input of uncorrected bits, including a first string of data bits and a second string of checkbits;
   generating error pointers from the input;
   generating checkbits using first string data bits; and
   correcting both the first string data bits and the generated checkbits using the error pointers.

9. The method recited in claim 8, wherein the step of generating error pointers comprises the step of generating first error pointers for use with the first string of bits and generating second error pointers for use with the generated checkbits.

10. The method recited in claim 9, wherein the step of generating error pointers from the input comprises the step of generating a syndrome of the input.

11. The method recited in claim 10, wherein the step of correcting is accomplished with XOR logic.

* * * * *